United States Patent
Goldspring et al.

(10) Patent No.: US 6,296,778 B1
(45) Date of Patent: Oct. 2, 2001

(54) METHOD AND APPARATUS FOR SIMULATING STANDARD TEST WAFERS

(75) Inventors: Gregory J. Goldspring, Alameda; Robert J. O'Donnell, Fremont, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/282,585

(22) Filed: Mar. 31, 1999

(51) Int. Cl.⁷ .................................................. H01L 21/00
(52) U.S. Cl. ................. 216/59; 216/67; 216/84; 438/14; 438/926
(58) Field of Search ................. 216/84, 59, 67; 438/14, 926

(56) References Cited

U.S. PATENT DOCUMENTS

| | | | |
|---|---|---|---|
| 5,711,848 | * | 1/1998 | Iturralde ............................ 438/14 |
| 5,866,437 | * | 2/1999 | Chen et al. ........................ 438/14 |
| 6,046,061 | * | 4/2000 | Tsao et al. ........................ 438/16 |

* cited by examiner

Primary Examiner—Randy Gulakowski
Assistant Examiner—Shamim Ahmed
(74) Attorney, Agent, or Firm—Martine & Penilla, LLP

(57) ABSTRACT

A method and apparatus are provided for simulating a standard wafer in semiconductor manufacturing equipment. The apparatus includes a support layer suitable for being handled by the semiconductor manufacturing equipment. Applied to the support layer is a mixture including a process agent and a material. During use, the present invention simulates a standard production wafer including material similar to that in the mixture of the present invention.

19 Claims, 4 Drawing Sheets

METHOD AND APPARATUS FOR SIMULATING STANDARD TEST WAFERS

FIELD OF THE INVENTION

The present invention relates generally to semiconductor test wafers and, more particularly, to a test wafer that effectively simulates "patterned" standard test wafers and can be produced at a reduced cost.

BACKGROUND OF THE INVENTION

In semiconductor fabrication, the necessary related equipment must often be tested and conditioned prior to being used to manufacture integrated circuits. Such testing and conditioning improve the quality and reliability of the manufactured integrated circuits by providing a preview of how the semiconductor manufacturing equipment operates during various processes. For example, "marathon experiments" are often conducted wherein a vast number of wafers are placed in a plasma chamber and etched in a conventional manner. Analysis of various device parameters and the end product during such marathon experiments provides information that is beneficial during the preparation for actual production of integrated circuits. In particular, data regarding particle emissions may be collected during the course of the marathon experiments to anticipate particle failure during the manufacture of integrated circuits.

To carryout such conditioning exercises and marathon experiments on semiconductor manufacturing equipment such as plasma chambers, standard test wafers are normally used in place of standard production wafers. A cross-section of a standard production wafer 10 and a standard test wafer 20 are shown in FIGS. 1 and 2, respectively. As shown, the standard test wafer 20 includes a wafer 22 including any type of materials thereon such as aluminum and the like. This standard test wafer 20 further has a layer of photoresist 24 thereon. By this structure, the standard test wafer 20 simulates a pair of uppermost layers 26 of the standard production wafer 10.

In order to properly simulate a standard production wafer 10, it is preferred that the photoresist 24 of the standard test wafer 20 be "patterned." In other words, the resist is ideally applied to the standard test wafer 20 to define a plurality of vias, channels, etc. which in turn leave a percentage of the standard test wafer 20 exposed as shown in FIG. 3.

Therefore, the use of standard test wafers 20 can be expensive, especially when standard test wafers 20 have multiple layers similar to standard production wafers 10. This cost often fails to justify many conditioning exercises and marathon experiments which, in turn, leads to reduced quality and reliability during the subsequent processing of standard production wafers 10.

One known prior art alternative to the use of such "patterned" standard test wafers 20 is to alternate between aluminum wafers and blanket photoresist wafers in a plasma chamber. Such method, however, tends to be cumbersome and time consuming since the aluminum and blanket photoresist wafers must be alternated during use. Further, the aluminum wafers and blanket photoresist wafers are not processed at the same time. As such, the present method fails to effectively simulate the composition of materials being deposited in the plasma chamber during the processing of standard production wafers. This in turn gives rise to detrimental ramifications in particle performance.

There is thus a need for a test wafer that effectively simulates "patterned" standard test wafers and can be produced at a reduced cost.

DISCLOSURE OF THE INVENTION

The present invention includes a method and apparatus for simulating a standard wafer in semiconductor manufacturing equipment. The present invention includes a support layer suitable for being handled by the semiconductor manufacturing equipment. Applied to the support layer is a mixture including a process agent and a material. During use, the present invention simulates a standard wafer including material similar to that in the mixture of the present invention.

By this design, the present invention offers a cost-effective substitution for standard test wafers. Moreover, the present invention better simulates standard test wafers by ensuring that byproducts are produced simultaneously. The ratio of byproducts of the present invention may also be tailored to simulate a specific percentages of area that is exposed through the process agent on a standard test wafer. This is accomplished by varying a volumetric ratio between the process agent and material within the mixture.

These and other advantages of the present invention will become apparent upon reading the following detailed description and studying the various figures of the drawings.

BRIEF DESCRIPTION OF THE DRAWINGS

The accompanying drawings, which are incorporated in and constitute part of this specification, illustrate exemplary embodiments of the invention and together with the description serve to explain the principles of the invention.

Prior Art

Prior Art

Prior Art

DETAILED DESCRIPTION OF THE PREFERRED EMBODIMENTS

Reference will now be made to the present preferred embodiments of the invention, examples of which are illustrated in the accompanying drawings.

Figure 1:
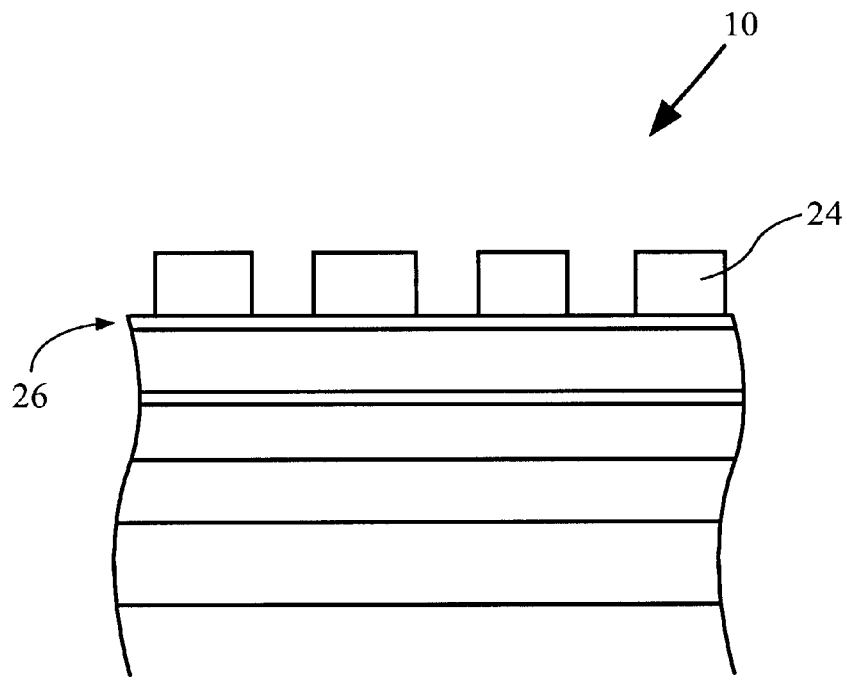
FIG. 1 is a vastly exaggerated cross-sectional view of a standard production wafer of the prior art.
Figure 2:
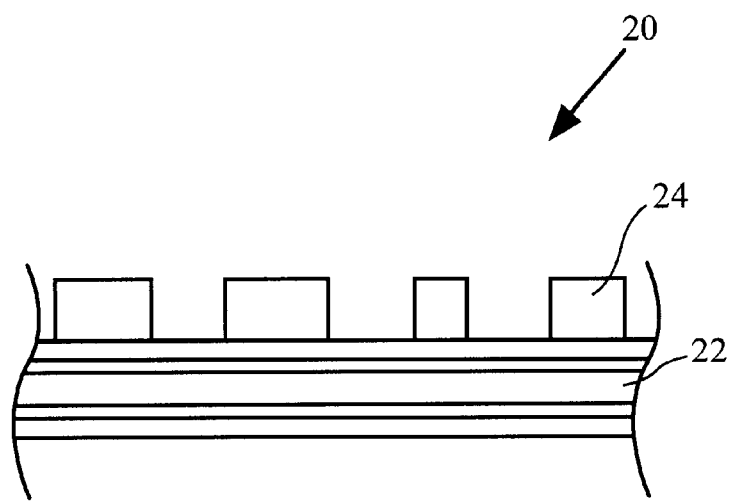
FIG. 2 is a vastly exaggerated cross-sectional view of a standard test wafer of the prior art.
Figure 3:
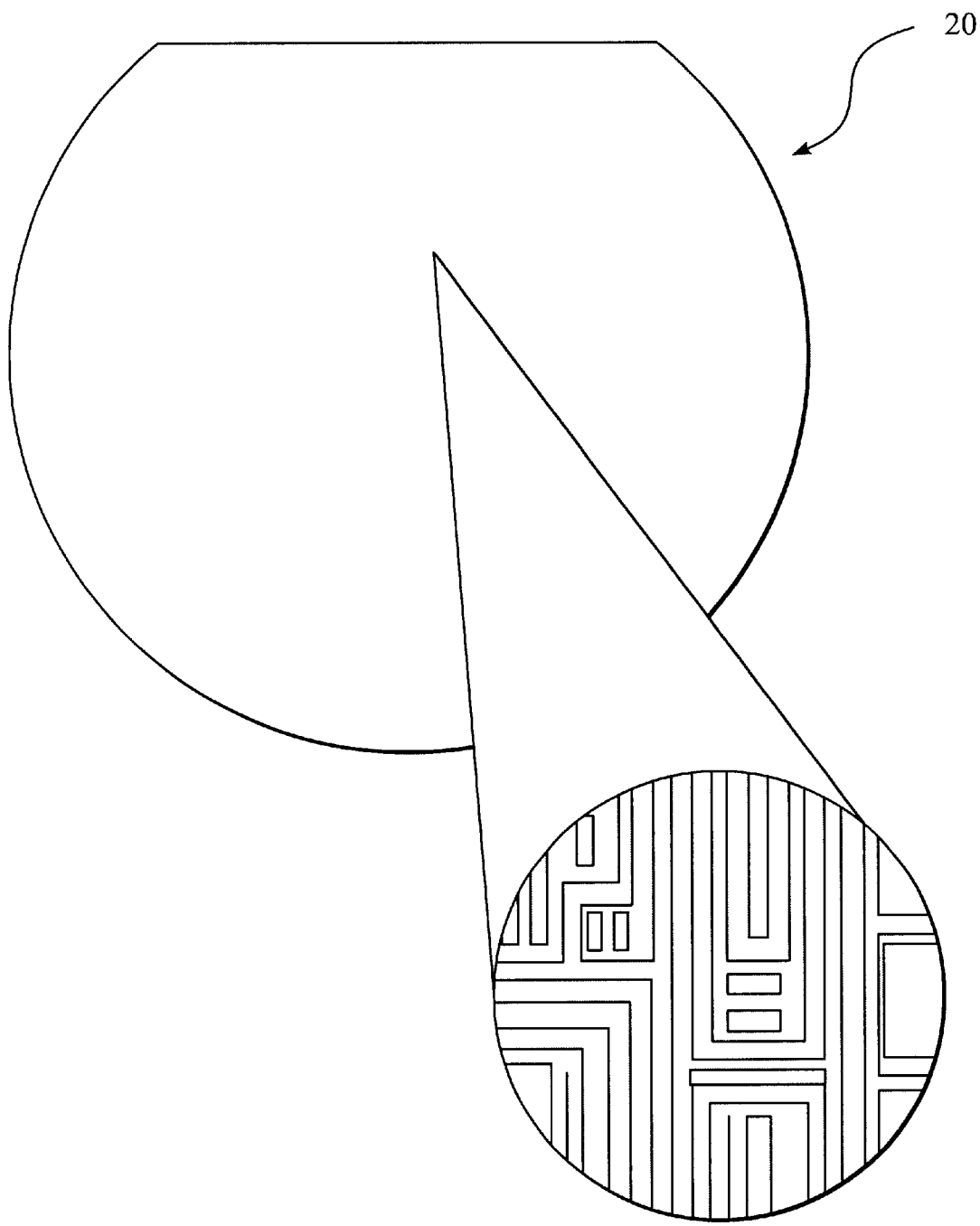
FIG. 3 is a top view of the standard test wafer of Prior Art FIG. 2 with a detailed view of the "patterned" photoresist.
Figure 4:
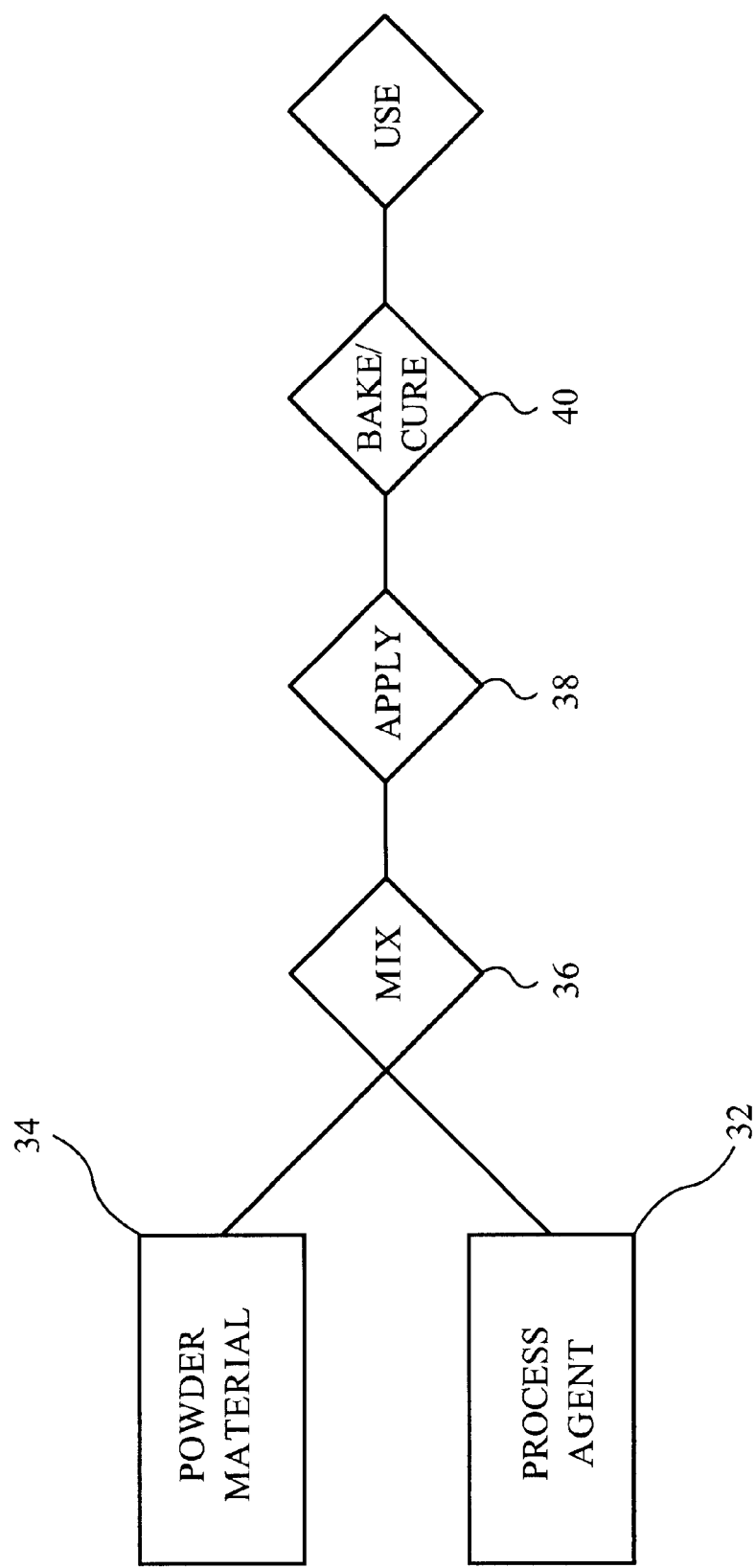
FIG. 4 is a flowchart delineating the process for manufacturing an apparatus suitable for use in simulating a standard test wafer in semiconductor manufacturing equipment, according to one embodiment of the present invention.
Figure 5:
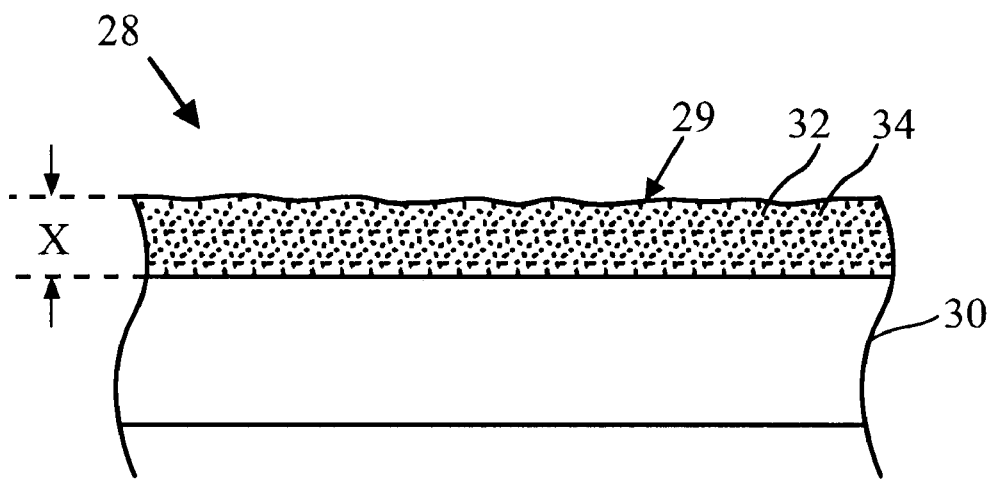
FIG. 5 is a vastly exaggerated cross-sectional view of the apparatus of the present invention prior to etching.
Figure 6:
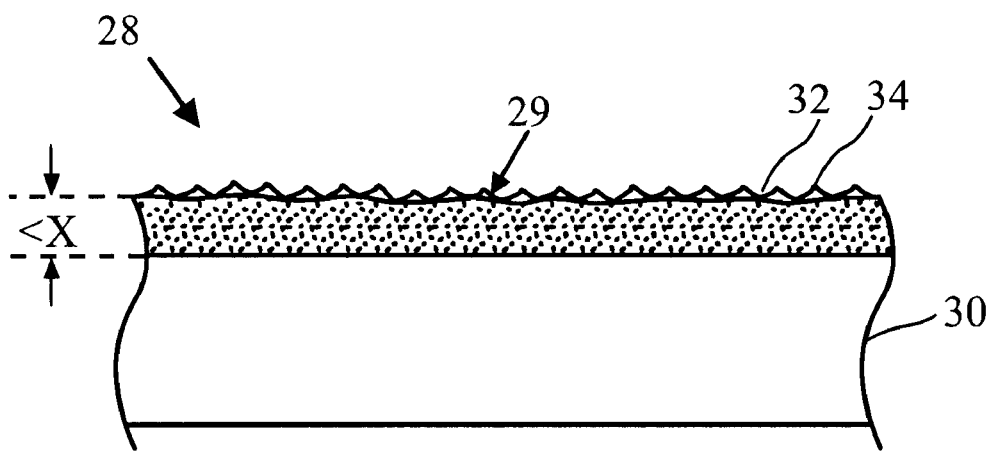
FIG. 6 is a vastly exaggerated cross-sectional view of the apparatus of the present invention after etching.

Prior Art FIG. 1 shows a standard production wafer 10. Prior Art FIGS. 2 and 3 illustrate a standard test wafer 20. As shown in FIGS. 4–6, one embodiment of the present invention includes a method and apparatus that is suitable for simulating the standard test wafer 20 in semiconductor manufacturing equipment such as a plasma chamber.

Turning to FIG. 5, a wafer 28 in accordance with one embodiment of the present invention will now be described. The wafer 28 includes a support layer 30 and a combination 29 of a process agent 32 and at least one predetermined material 34. The support layer 30 may be constructed from any type of material suitable for being handled by the semiconductor manufacturing equipment. In various embodiments, the material 34 may include, but is not limited to, silicon, an oxide, metal, plastic, any material commonly known in the semiconductor arts, or any other material capable of being handled by the semiconductor manufacturing equipment. Further, in one embodiment, the support layer 30 may be shaped in the form of a substantially planar disc or wafer having a generally circular periphery. In the alternative, the support layer 30 may take the form of a flat panel, an optical substrate, or any other type of support mechanism which is capable of supporting the mixture.

The process agent 32 and the material 34 may take the form of a mixture which is applied to the support layer 30. Further, the process agent 32 may include a photoresist such as a deep-UV photoresist or any components thereof, a polymer, or a resin such as Novolac™ resin which is a component of a conventional I-line photoresist. It should be noted, however, that the process agent 32 may include any type of suitable substance which is associated with photolithography, etching or any other manufacturing process.

With respect to the material 34, the same may include any substance for the purpose of simulating a standard test wafer 20 including the material 34. Depending on the application at hand, the mixture need not be limited to only a single material 34. Table 1 shows a list of examples of potential materials 34 and the wafer which each is designed to simulate. Such list is not to be deemed as exhaustive and may include any type of material(s).

TABLE 1

| Standard Wafer Type | Appropriate Simulation Material |
|---|---|
| Aluminum | Aluminum (Al) |
| Polysilicon | Silicon (Si) |
| Tungsten interconnect/etchback | Tungsten (W) |
| Tungsten Silicide | Tungsten Silicide ($WSi_2$) |
| Titanium | Titanium (Ti) |
| Titanium Nitride | Titanium Nitride (TiN) |
| Silicon Dioxide | Silicon Dioxide ($SiO_2$) |
| Platinum | Platinum (Pt) |
| Ruthenium | Ruthenium (Ru) |
| Ruthenium Oxide | Ruthenium Oxide ($RuO_2$) |
| Copper | Copper (Cu) |
| Tantalum | Tantalum (Ta) |
| Nickel | Nickel (Ni) |

The method associated with the construction of the apparatus of the present invention will now be set forth with specific reference to FIG. 4. As mentioned earlier, the material 34 and the process agent 32 are combined to form the mixture. Note box 36 of FIG. 4. In the case where the material is aluminum in a powder form, such powder may comprise of particulates with a size in the order of 20 $\mu$m. It should be understood, however, that the particulates may have any microscopic or macroscopic size.

As will soon become apparent, a volumetric ratio between the material 34 and the process agent 32 may be selected in order to simulate a percentage of an area that is exposed through the process agent 32 on a "patterned" standard test wafer 20. For example, a 2:1 volumetric ratio between the material 34 and the process agent 32 may simulate an exposed area A on the simulated standard test wafer 20 while a 3:1 volumetric ratio between the material 34 and the process agent 32 may simulate an exposed area greater than A on the simulated standard test wafer 20. In various alternate embodiments, other types of ratios may be employed for partitioning the material 34 and the process agent 32 such as a mass ratio, density ratio, etc.

Thereafter, the mixture is applied to the support layer 30, as indicated by box 38 of FIG. 4. Application of the mixture may be carried out in various ways including, but not limited to spraying, spinning or brushing the mixture onto the support layer 30. While applying the mixture to the support layer 30, any type of known technique may be employed to prevent the accumulation of the mixture adjacent the periphery of the support layer 30.

As indicated by box 40 of FIG. 4, the mixture is subsequently baked at a temperature and for a period of time sufficient to "cure" the process agent. In one embodiment, the mixture may be baked at 120°–130° F. for 10–15 minutes. It should be noted that the baking may be carried out with any effective means including a hot plate, oven or the like. After baking, the present invention is then complete and ready to be used in place of a standard test wafer 20 in a plasma chamber or the like.

In use, the present invention is placed within the semiconductor plasma chamber and is subsequently etched using conventional processes and techniques. During etching, the present invention produces byproducts and behaves in a manner similar to the "patterned" standard test wafer 20 that is to be simulated. As mentioned earlier, the process agent 32 on a "patterned" standard test wafer 20 is distributed upon a predetermined percentage of the surface area of the wafer. Accordingly, as the process agent 32 and wafer are etched, byproducts from the process agent 32 and the wafer are emitted simultaneously during the etching processes.

Similarly, during the etching of the present invention, the mixture of the material 34 and process agent 32 are exposed together as a combination, as shown in FIG. 6. As such, within the plasma chamber the present invention appears as being no different than a corresponding "patterned" standard test wafer 20. Therefore, the present invention simulates the etching of a "patterned" standard test wafer 20, but by a means that is vastly less expensive in comparison.

In terms of cost effectiveness, the present invention appears to offer a sizable reduction in cost with respect to conditioning plasma chambers and running related marathon experiments with "patterned" standard test wafers 20. As mentioned earlier, marathon experiments are procedures wherein a vast number of wafers are placed in the plasma chamber and etched in a conventional manner for testing purposes. The reduction in cost results from not only avoiding the use of expensive standard test wafers 20, but also providing a test article that can be processed for a greater amount of time.

For example, a standard test wafer 20 manufactured by Sematech™ costs approximately $300.00 and can be etched for 1.3 RF minutes. This translates into a cost of $230.00/RF minute to use such standard test wafer 20. In contrast, in one embodiment of the present invention wherein aluminum powder is employed with a 1:2 volumetric ratio to a process agent such as photoresist, each unit costs $6.70 and can be etched for 120 RF minutes. This results in a cost of approximately $0.63/RF minute, less than 1% the cost associated with processing the standard test wafer 20.

Although only a few embodiments of the present invention have been described in detail herein, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. In a semiconductor plasma chamber, a method for simulating a standard wafer using an apparatus composed of a mixture of a process agent and a material applied to a support layer, the method comprising:

placing the apparatus within the semiconductor plasma chamber;

etching the apparatus; and simulating the standard wafer by simultaneously producing byproducts during the etching that are simulating to byproducts by the standard wafer.

2. The method of claim 1, wherein the process agent is photoresist.

3. The method of claim 1, wherein the material is silicon dioxide to simulate a wafer including polysilicon.

4. The method of claim 1, wherein the material is tungsten to simulate a wafer including tungsten.

5. The method of claim 1, wherein the material is tungsten suicide to simulate a wafer including tungsten suicide.

6. The method of claim 1, wherein the material is titanium to simulate a wafer including titanium.

7. The method of claim 1, wherein the material is titanium nitride to simulate a wafer including titanium nitride.

8. The method of claim 1, wherein the material is silicon dioxide to simulate a wafer including silicon dioxide.

9. The method of claim 1, wherein the material is aluminum to simulate a wafer including aluminum.

10. The method of claim 1, wherein the material is platinum to simulate a wafer including platinum.

11. The method of claim 1, wherein the material is ruthenium to simulate a wafer including ruthenium.

12. The method of claim 1, wherein the material is ruthenium oxide to simulate a wafer including ruthenium oxide.

13. The method of claim 1, wherein the material is copper to simulate a wafer including copper.

14. The method of claim 1, wherein the material is tantalum to simulate a wafer including tantalum.

15. The method of claim 1, wherein the material is nickel to simulate a wafer including nickel.

16. The method of claim 1, wherein the support layer is at least one of a disc and a wafer.

17. The method of claim 1, wherein the support layer includes at least one of silicon, metal, plastic, and an oxide.

18. The method of claim 1, wherein the material and the process agent are baked on the support layer.

19. The method of claim 1, wherein a ratio between the material and the process agent corresponds to an exposed area on the wafer to be simulated.

* * * * *